April 4, 1967 B. E. GUISINGER 3,312,836

CIRCUITRY FOR POSITIONING GATING WAVEFORMS FOR GATING WITH MINIMIZED SWITCHING TRANSIENTS

Filed Jan. 16, 1964

BARRETT E. GUISINGER
INVENTOR.

BY James H. Griffin
ATTORNEY

United States Patent Office 3,312,836

Patented Apr. 4, 1967

3,312,836

CIRCUITRY FOR POSITIONING GATING WAVEFORMS FOR GATING WITH MINIMIZED SWITCHING TRANSIENTS

Barrett E. Guisinger, Redwood City, Calif., assignor to Ampex Corporation, Redwood City, Calif., a corporation of California Filed Jan. 16, 1964, Ser. No. 338,034
8 Claims. (Cl. 307—88.5)

Figure 1:
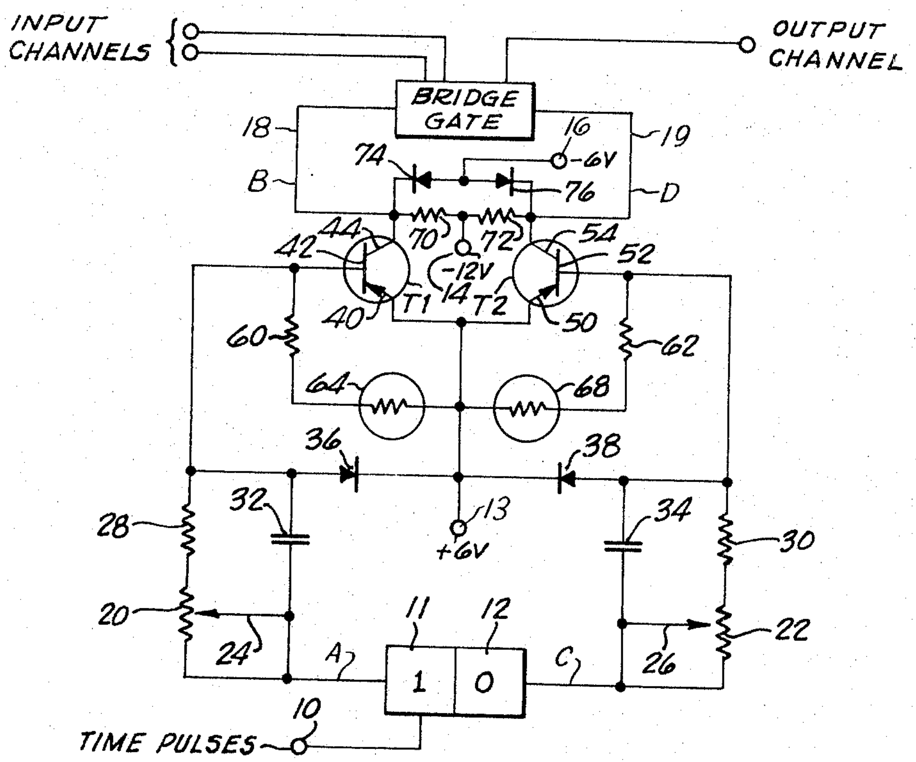

This invention relates to switching circuitry and more particularly to circuitry for achieving high-speed gating with minimum switching transient.

In the tape recording art and in many others, electronic switching is normally performed with gates, diode bridges, or the like opened and closed by closely timed and shaped waveforms produced by a bi-stable multivibrator triggered by a clock (or time) pulse. For relatively slow switching time—½ microsecond or longer—the multivibrator output is adequate, although during the switching interval, when both gates are open and conducting to some degree, the amplitude of the output is distorted by the cumulation of both gated signals. This amplitude distortion can be highly undesirable where the amplitude of the output waveform is a critical factor, as in direct tape recording, in FM tape recording after demodulation, or on any circuit where the signal being switched is in final, output form.

To reduce amplitude distortion, it is necessary to reduce switching time; yet the reduction of switching time below the ½ microsecond level requires that the gating waveform have an almost square leading edge, which will produce transients. The transients arise because all components of a gating bridge have some internal capacitance which will shunt the component for a short initial period after the imposition of a sudden change in current. No matter how carefully the components of a gating bridge are selected, their internal capacitances will vary by at least 1 pf.; yet even this 1 pf. variance may produce differences in capacitance of two hundred percent or more. Thus, at high switching speeds (i.e. steep gate pulse leading edge), the capacitive unbalance inherent in all gate circuits will produce an undesirable transient spike. Even if gate components could be so carefully selected that their capacitances would balance, the result would soon be undone by aging or replacement.

Therefore, the general object of this invention is to provide improved gating circuitry.

Another object of this invention is to reduce amplitude distortion in gating circuitry.

Another object is to achieve fast switching times in gating circuitry without producing excessive switching transients.

Another object is to eliminate the effects of capacitive imbalance of gate circuit components by adjustment of the circuit rather than by selection of the components.

Another object is to achieve extreme accuracy in the positioning of pulses by the use of an adjustable delay circuit.

In the achievement of the above objects and as a feature of applicant's invention, there is provided an adjustable positioning circuit between a bi-stable multivibrator and a bridge gate to position the gating waveforms exactly with reference to each other, so that the leading edge at one end of the gate lags the leading edge at the other. The amount of lag is such that capacitances of the bridge gate components cancel out and no transient appears at the output.

As another feature of applicant's invention, two high capacitance diodes are used to inject a slight delay into the multivibrator gating pulse, by virtue of the length of their storage or recovery times. As another feature, the positioning circuit is made temperature stable by the employment in parallel with the high capacitance diodes of circuit elements having behavior-change due to temperature that offsets the temperature-dependent behavior change of the diodes, at least as far as the required gating pulse delay is concerned.

Figure 2:
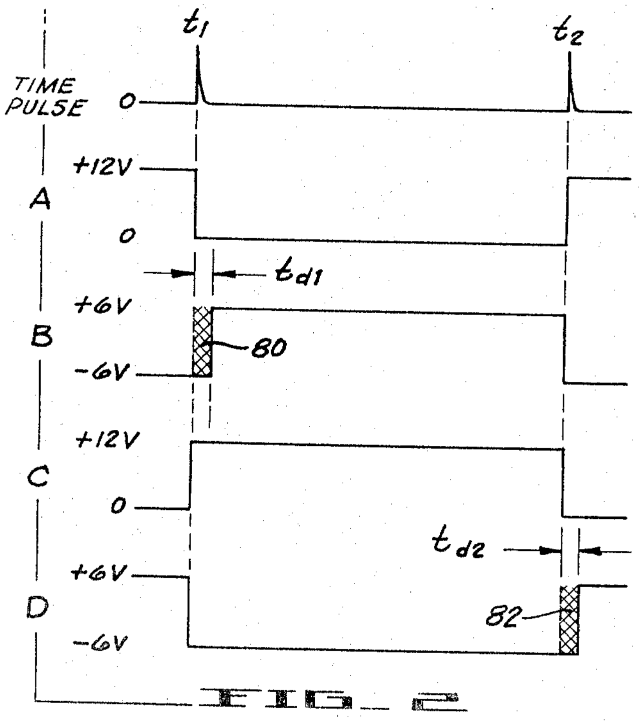

The above and other objects and features of applicant's invention and a better understanding thereof may be had by referring to the following detailed description and claims, taken in conjunction with the accompanying drawings, in which:

FIGURE 1 is a circuit diagram of a preferred embodiment of applicant's invention; and FIGURE 2 is a graph showing the input and output waveforms for each side of the circuit in FIGURE 1.

Referring to FIGURE 1, applicant's preferred circuit has a source of time pulses 10, a bi-stable multivibrator having first stage 11 and second stage 12, and power supply terminals 13, 14, and 16, here shown as +6, −12, and −6 volts, respectively. Output terminals 18, 19 couple the output of applicant's circuit to the opposite input terminals of a conventional bridge gate (represented in block form only). No ground or common terminal is shown, in the interest of simplicity.

The first and second stage output terminals of the multivibrator 10 are respectively coupled to variable resistors 20, 22 having adjustable contacts 24, 26. The resistors 20, 22 have resistors 28, 30 connected at their other end. The variable resistor contacts 24, 26 are connected to their respective multivibrator output leads and to capacitors 32, 34. The resistor 28 and the capacitor 32 are both coupled through a diode 36 to the power supply 13. The resistor 30 and the capacitor 34 are coupled through the diode 38 to the power supply 13.

Applicant's circuit has two transistors T1, T2 having emitters 40, 50, bases 42, 52, and collectors 44, 54, respectively. The emitters 40, 50 are joined together and are coupled to the power supply 13. The base 42 is directly coupled to the resistor 28, the capacitor 32 and the diode 36. The base 52 is directly coupled to the resistor 30, the capacitor 34 and the diode 38. The bases 42, 52 are also coupled to the power supply 13 through resistors 60, 62 and thermistors 64, 68, respectively.

The collectors 44, 54 of the transistors T1, T2 are directly coupled to the output terminals 18, 19. They are also coupled to the power supply 14 through the resistors 70, 72, respectively, and to the power supply 16 through the diodes 74, 76, respectively.

Referring to FIGURE 2, the input waveforms supplied by the bi-stable multivibrator for a half cycle of operation are shown at (A) and (C). The resulting output waveforms are shown at (B) and (D). Thus, it can be seen that the output of the first stage 11 (A) is 12 volts while the output of the second stage 12 of the bi-stable multivibrator is zero volts (C). At time $t_1$, the bi-stable multivibrator switches, and at time $t_2$ it switches back again.

The corresponding output waveforms at terminal 18 (FIGURE 2, D) and terminal 19 (FIGURE 2, D) are shown to be waveforms going between +6 volts and −6 volts. The beginning of the positive going portion of each output waveform (B), (D), is shown as delayed for a short time. These delay periods 80, 82 are the main object of the circuitry shown in FIGURE 1.

In the operation of the above-described circuit, when the first stage 11 of the bi-stable multivibrator is "on" (i.e. supplying +12 v., as shown in FIGURE 2, A before time $t_1$ and after time $t_2$), the voltage of the base 42 is above the voltage of the emitter 40. Transistor T1 is, therefore, cut off; and the voltage appearing at the terminal 18 is that of terminal 16. At the same time, the second stage 12 of the bi-stable multivibrator is producing no voltage (FIGURE 2, C, before +1) and the base 52 is at a voltage far enough below that of the emitter 50 to saturate the transistor T2. Since during saturation the collector 54 is very near in voltage to the emitter 50, the voltage at 19 is that of the power supply 13, +6 v.

At time $t_1$, the bi-stable multivibrator switches, and the output of the first stage 11 drops to zero while the second stage output rises to +12 v. The leading edge of the second stage output is applied directly through the resistors 22 and 30 to the base 52 to cut off instantaneously the transistor T2, whereupon the voltage at the terminal 19 becomes that of the power supply 16, −6 volts (FIGURE 2, D).

On the T1 side of the circuit, however, the effect of the "flip" of the bi-stable multivibrator is delayed, resulting in the delay shown at 80 of the gate pulse appearing at terminal 18; for the high capacitance of the diode 36 will not permit the voltage drop across it to be reversed instantaneously. Thus, until the diode 36 can discharge through the resistors 20 and 28 and the capacitor 32, the voltage on the base 42 does not drop. Until it does drop, the transistor T1 remains cut off, and the voltage at the terminal 18 remains at −6 volts.

The speed with which the diode 36 discharges when the first stage 11 switches off is determined partially by the values of the resistors 20 and 28 and of the capacitor 32. The resistor 20 being variable by adjustment of the contact 24, which is shorted to the first stage 11, the discharge time of the diode is variable, and thus the firing time delay of the transistor T1 can be adjusted to make the time delay $t_{d1}$ precisely the right amount to eliminate the switching transient of the gate. The adjustment of the variable resistor 20 is accomplished by putting the gating system into operation, observing the output on an oscilloscope, and varying the resistance until the transients appearing on the scope are minimized.

Because the diode 36 is not temperature stable, the resistor 60 and thermistor 64 have been placed in parallel therewith. With rises in temperature, the storage time of the diode 36 is increased; so to compensate for this, the thermistor 64 bleeds more current.

In like manner, at time $t_2$ the time delay $t_{d2}$, represented by the shaded area 82, results from the high capacitance characteristics of the diode 38. The second stage 12 of the bi-stable multivibrator switches off, but the diode 38 will not allow the voltage at the base 52 to drop immediately to the point where the transistor T2 will conduct. Instead, the voltage across the diode 38 must degenerate with the discharge of current through the resistors 22 and 30 and the capacitor 34. As with the variable resistor 20, the variable resistor 22 can be adjusted to provide the precise discharge time necessary to eliminate switching transients in the gate output at time $t_2$. Likewise, the thermistor 68 provides temperature compensation for the diode 38 in the same way that the thermistor 64 did for the diode 36.

Thus, applicant has provided an *improved gating system*, featuring the above-described adjustable positioning circuit, which utilizes fast switching to eliminate amplitude distortion and yet does not produce the undesirable switching transients experienced heretofore. Applicant's adjustable delay circuit is capable of great accuracy in the positioning of pulses and thus is usable not only for positioning gating waveforms with reference to each other, but also for the positioning of gating or other waveforms according to an absolute time reference or delay requirement. If two such circuits were "cascaded," both these functions could be accomplished.

It should be noted that the term "rapid switching" as employed in the previous description is a relative one and that a relatively rapid overall switching time may still be attained even though the switching is slightly delayed. In this regard, consider rapid switching time to be something less than ½ microsecond (i.e., $0.5 \times 10^{-6}$ seconds). Thus a switching time of $0.1 \times 10^{-6}$ seconds, for example, is considered rapid and would normally produce transients in a gating bridge. Pulses from an ordinary transistorized flip-flop may have gating switch speeds and/or output pulse rise times of, for example, $0.05 \times 10^{-6}$ seconds. Transients can be eliminated by delaying the leading edges of such flip-flop pulses by $0.02 \times 10^{-6}$ seconds. The overall transient-free switching time is then $0.07 \times 10^{-6}$ seconds which is considerably less than the switching time of $0.1 \times 10^{-6}$ seconds defined as being rapid. It therefore follows that even though some sacrifice is made in switching time by intentionally introducing a delay in accordance with the present invention, the switching time is still rapid and the advantages of transient-free switching are obtained.

A *waveform positioner* in accordance with the above description and drawing was built and operated using the following components:

| | | |
|---|---|---|
| Voltages: | | |
| 13 | v | +6 |
| 14 | v | −12 |
| 16 | v | −6 |
| Transistors: | | |
| T1 | | 2N1500 |
| T2 | | 2N1500 |
| Diodes: | | |
| 36 | | 1N792 |
| 38 | | 1N792 |
| 74 | | S570G |
| 76 | | S570G |
| Resistors (ohms): | | |
| 20 | | 2500 |
| 22 | | 2500 |
| 28 | | 620 |
| 30 | | 620 |
| 60 | | 360 |
| 62 | | 360 |
| 70 | | 620 |
| 72 | | 620 |
| Capacitors: | | |
| 32 | pf | 110 |
| 34 | pf | 110 |
| Thermistors: | | |
| 64 | | (1) |
| 68 | | (1) |

[1] Ampex Part No. 046–002.

A number of alternative arrangements will suggest themselves to those skilled in the art. For example, N-P-N conductivity type transistors could be employed in place of the P-N-P conductivity type transistors shown, if only the power supply voltages were reversed and other appropriate changes were made in the circuit. However, although the invention has been described with a certain degree of particularity, it is to be understood that the present disclosure has been made only by way of example, and that numerous changes in the details of construction and the combination and arrangement of parts may be resorted to without departing from the spirit and the scope of the invention as hereinafter claimed.

What is claimed is:

1. A gating system having a source of time pulses; a bi-stable multivibrator coupled to said source of time pulses, said bi-stable multivibrator having two output terminals; two variable resistors connected one to each said multivibrator output terminal; two diodes connected one between each said variable resistance and a first power supply; and two transistors each having an emitter, a base, and a collector, the emitters of said transistors being joined and directly coupled to said first power supply and the bases of said transistors being directly coupled one to the junctions between each of said variable resistors and said diodes, and a second power supply of polarity opposite that of said first supply coupled to said collectors of said transistors.

2. A gating system according to claim 1, further defined by two thermistors one coupled between each said base and said first power supply.

3. A circuit for positioning a waveform comprising an active switching element having input, output, and control electrodes, said control electrode of said switching element receiving said waveform, power supply means coupled to said input and output electrodes of said switching element, a high capacitance diode coupled between said control electrode and input electrode of said switching element to prevent instantaneous voltage changes in one direction on the control electrode and permit instantaneous voltage changes in the opposite direction, and a variable resistor coupled between said high capacitance diode and a source of reference potential to provide a discharge path for the diode determinative of the time required for said voltage to change in said one direction.

4. A circuit for positioning waveforms according to claim 3, further defined by a temperature-responsive resistance element coupled in parallel with said diode to compensate for temperature variation thereof.

5. A circuit for positioning waveforms according to claim 4, further defined by said temperature-responsive resistance element being a thermistor coupled in parallel with said diode.

6. In a gating system operated by a timing pulse source, said system having first and second gate inputs for receiving first and second trains of complementary timing pulses from first and second outputs of said source, the combination comprising a delay circuit coupled between said outputs of said source and said gate inputs of said system, said delay circuit including means for independently delaying the leading edges of the pulses of said first train while maintaining the trailing edges of said pulses of said first pulse train unchanged in time, said delay circuit further including means for independently delaying the trailing edges of the pulses of said second train while maintaining the leading edges of the pulses of said second pulse train unchanged in time.

7. The combination of claim 6, further defined by said delay circuit including adjustment means for precisely varying the delays of the leading edges of the pulses of said first train and the trailing edges of the pulses of said second train.

8. The combination of claim 6, further defined by high capacitance diodes in said delay circuit, and means for connecting said diodes for rapidly coupling the trailing edges of the pulses of said first train and the leading edges of the pulses of said second train to said first and second gate inputs of said system and delaying coupling of the leading edges of the pulses of said first train and the trailing edges of the pulses of said second train to said first and second gate inputs for the storage times of said diodes.

References Cited by the Examiner

UNITED STATES PATENTS

| | | | |
|---|---|---|---|
| 2,939,969 | 6/1960 | Kwap et al. | 307—88.5 |
| 3,028,552 | 4/1962 | Hahs | 328—63 X |
| 3,134,030 | 5/1964 | Dao | 307—88.5 |
| 3,153,200 | 10/1964 | Wahrman et al. | 328—55 |
| 3,185,865 | 5/1965 | Larey | 307—88.5 |
| 3,187,200 | 6/1965 | Gardner et al. | 307—88.5 |
| 3,193,695 | 7/1965 | Monahan | 307—88.5 |
| 3,238,461 | 3/1966 | Merriam | 328—55 X |

ARTHUR GAUSS, *Primary Examiner.*

J. S. HEYMAN, *Assistant Examiner.*